United States Patent
Hsu et al.

(10) Patent No.: US 9,761,687 B2
(45) Date of Patent: Sep. 12, 2017

(54) METHOD OF FORMING GATE DIELECTRIC LAYER FOR MOS TRANSISTOR

(71) Applicant: UNITED MICROELECTRONICS CORP., Hsin-Chu (TW)

(72) Inventors: Han-Lin Hsu, Kaohsiung (TW); Po-Lun Cheng, Kaohsiung (TW); Chun-Liang Chen, Tainan (TW); Meng-Che Yeh, Tainan (TW); Shih-Jung Tu, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 97 days.

(21) Appl. No.: 14/588,975

(22) Filed: Jan. 4, 2015

(65) Prior Publication Data

US 2016/0196971 A1    Jul. 7, 2016

(51) Int. Cl.
*H01L 29/66* (2006.01)
*H01L 21/28* (2006.01)
*H01L 29/51* (2006.01)
*H01L 29/02* (2006.01)
*H01L 21/02* (2006.01)

(52) U.S. Cl.
CPC .... *H01L 29/66477* (2013.01); *H01L 21/0234* (2013.01); *H01L 21/02326* (2013.01); *H01L 21/02332* (2013.01); *H01L 21/02337* (2013.01); *H01L 21/28202* (2013.01); *H01L 29/518* (2013.01); *H01L 29/6659* (2013.01); *H01L 29/513* (2013.01)

(58) Field of Classification Search
CPC ......... H01L 21/02337; H01L 21/02329; H01L 21/02332; H01L 21/02323; H01L 21/02326; H01L 21/02334; H01L 29/66477; H01L 29/518

See application file for complete search history.

(56) References Cited

U.S. PATENT DOCUMENTS

| | | | |
|---|---|---|---|
| 6,207,586 B1 * | 3/2001 | Ma | C23C 16/345 257/E21.269 |
| 7,429,538 B2 | 9/2008 | Olsen | |
| 7,811,892 B2 * | 10/2010 | Wang | H01L 21/3144 438/290 |
| 8,441,078 B2 | 5/2013 | Chambers | |
| 2003/0194853 A1 * | 10/2003 | Jeon | H01L 21/28185 438/591 |
| 2004/0175961 A1 * | 9/2004 | Olsen | H01L 21/28185 438/786 |
| 2007/0207628 A1 * | 9/2007 | Chua | H01L 21/3144 438/769 |

(Continued)

FOREIGN PATENT DOCUMENTS

CN    103400765 A  * 11/2013  ........... H01L 21/477

*Primary Examiner* — Daniel Luke
*Assistant Examiner* — Khatib Rahman
(74) *Attorney, Agent, or Firm* — Winston Hsu

(57) ABSTRACT

A method of forming a gate dielectric layer for a MOS transistor includes the following steps. A gate dielectric layer is formed on a substrate. A nitridation process is performed on the gate dielectric layer. A multi-step post nitridation annealing process including two oxygen-containing annealing steps with different respective annealing temperatures is performed on the gate dielectric layer.

17 Claims, 4 Drawing Sheets

(56) References Cited

U.S. PATENT DOCUMENTS

| | | | |
|---|---|---|---|
| 2008/0000551 A1* | 1/2008 | Sato | H01L 21/3144 148/222 |
| 2008/0194091 A1* | 8/2008 | Lin | H01L 21/28202 438/591 |
| 2011/0204454 A1* | 8/2011 | Chambers | H01L 21/28202 257/411 |
| 2012/0329285 A1 | 12/2012 | Wang | |

* cited by examiner

METHOD OF FORMING GATE DIELECTRIC LAYER FOR MOS TRANSISTOR

BACKGROUND OF THE INVENTION

1. Field of the Invention

The present invention relates generally to a method of forming a gate dielectric layer for a MOS transistor, and more specifically to a method of forming a gate dielectric layer for a MOS transistor that includes a multi-step post nitridation annealing process.

2. Description of the Prior Art

With the development of very large scale integration (VLSI), the low electricity consumption and high integration of metal-oxide-semiconductor (MOS) transistors makes them suitable to be widely applied in semiconductor processes. A MOS transistor comprises a gate on a substrate and two semiconductor regions (a source and drain) in the substrate, located on each side of the gate and having an electrical characteristic opposite to that of the substrate. The main structure of the gate is composed of a gate oxide layer and a gate conductive layer. When a proper bias is added to the gate, the MOS transistor can be regarded as a solid switch to control the connection of current.

The gate oxide layer is sandwiched by the gate conductive layer and the substrate, and isolates the gate conductive layer from the substrate to provide said function. The performance of this formed MOS transistor such as negative bias temperature instability (NBTI), reliability, yields or circuit leakage relies on the properties of the gate oxide layer. Thus, improving the properties of the gate oxide layer will have a direct effect on the performance of the entire transistor.

SUMMARY OF THE INVENTION

The present invention provides a method of forming a gate dielectric layer for a MOS transistor, which performs a multi-step post nitridation annealing process including two oxygen-containing annealing steps with different annealing temperatures to change the properties of the gate dielectric layer. This method improves reliability, yields, circuit leakage and negative bias temperature instability (NBTI) of a formed MOS transistor.

The present invention provides a method of forming a gate dielectric layer for a MOS transistor, including the following steps. A gate dielectric layer is formed on a substrate. A nitridation process is performed on the gate dielectric layer. A multi-step post nitridation annealing process including two oxygen-containing annealing steps with different annealing temperatures is performed on the gate dielectric layer.

The method of forming a gate dielectric layer for a MOS transistor forms a gate dielectric layer, performs a nitridation process on the gate dielectric layer, and then performs a multi-step post nitridation annealing process on the dielectric layer. It is emphasized that the multi-step post nitridation annealing process of the present invention must include two oxygen-containing annealing steps with different annealing temperatures to reduce defects and the pin-hole issue by filling oxygen atoms into these areas while also keeping nitrogen atoms at the surface of the gate dielectric layer or even pushing nitrogen atoms to the surface of the gate dielectric layer via the oxygen atoms. The surface of the gate dielectric layer which was damaged or degraded during previous processes or processing steps can thereby be fixed and repaired without further pushing nitrogen atoms of the gate dielectric layer to the surface. Most of the nitrogen atoms can be concentrated at the surface of the gate dielectric layer, so the nitrogen concentration can decrease dramatically as the distance from the gate dielectric layer to the surface is increased, and the nitrogen concentration can be distributed smoothly. Thereby, a formed device such as a MOS transistor applying the dielectric layer of the present invention can have a better reliability, negative bias temperature instability (NBTI), yields and circuit leakage performance.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
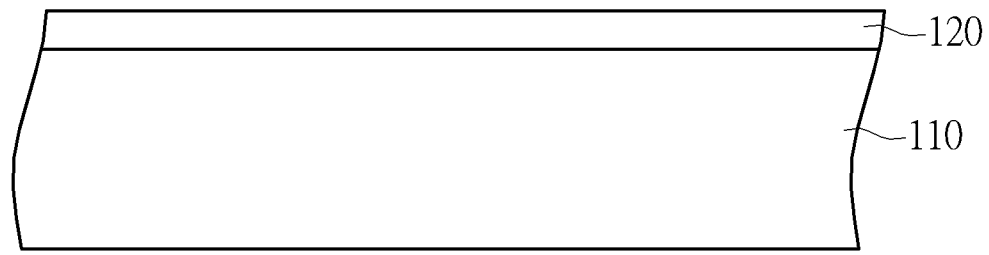
FIGS. 1-6 schematically depict cross-sectional views of a method of forming a gate dielectric layer for a MOS transistor according to an embodiment of the present invention.

FIGS. 1-6 schematically depict cross-sectional views of a method of forming a gate dielectric layer for a MOS transistor according to an embodiment of the present invention. As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. A gate dielectric layer 120 is formed on the substrate 110. The gate dielectric layer 120 may be a silicon oxide layer, a silicon oxynitride layer or a hafnium oxide layer or a combination thereof, but is not limited thereto. The method of forming a gate dielectric layer of the present invention can be applied in gate processes such as in a polysilicon gate process, a gate last process or a gate first process, wherein the gate last process includes a gate last process for buffer layer first and High-K first process, a gate last process for buffer layer first and High-K last process, or a gate last process for buffer layer last and High-K last process. Thus, the gate dielectric layer 120 of the present invention may be a gate dielectric layer, a buffer layer or/and a dielectric layer having high dielectric constant, but is not limited thereto. In this embodiment, the gate dielectric layer 120 is a silicon dioxide layer, which may be formed through an in situ steam generated (ISSG) process or a dry oxidation process, and the method of forming a gate dielectric layer in this embodiment is applied in a polysilicon gate process, but is not limited thereto.

Figure 2:
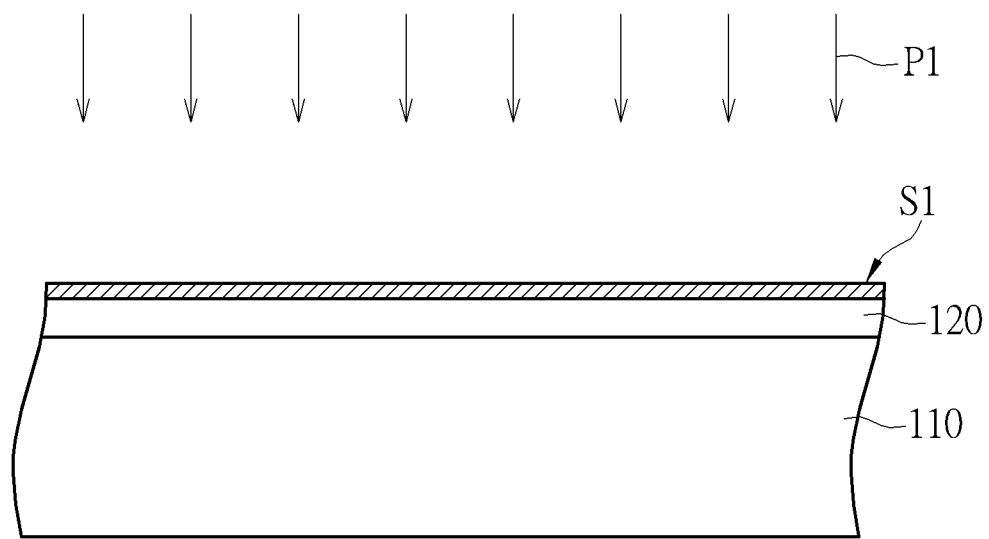

As shown in FIG. 2, a nitridation process P1 may be selectively performed on the gate dielectric layer 120. In a preferred embodiment, the nitridation process P1 is a decouple plasma nitridation (DPN) process, but is not limited thereto. The decouple plasma nitridation (DPN) process can only nitridize a surface S1 of the gate dielectric layer 120, enabling the surface S1 of the gate dielectric layer 120 to contain nitrogen atoms without having them diffusing into the substrate 110, thereby preventing the substrate 110 from being damaged by plasma, and increasing the reliability of the formed semiconductor structure.

Figure 3:
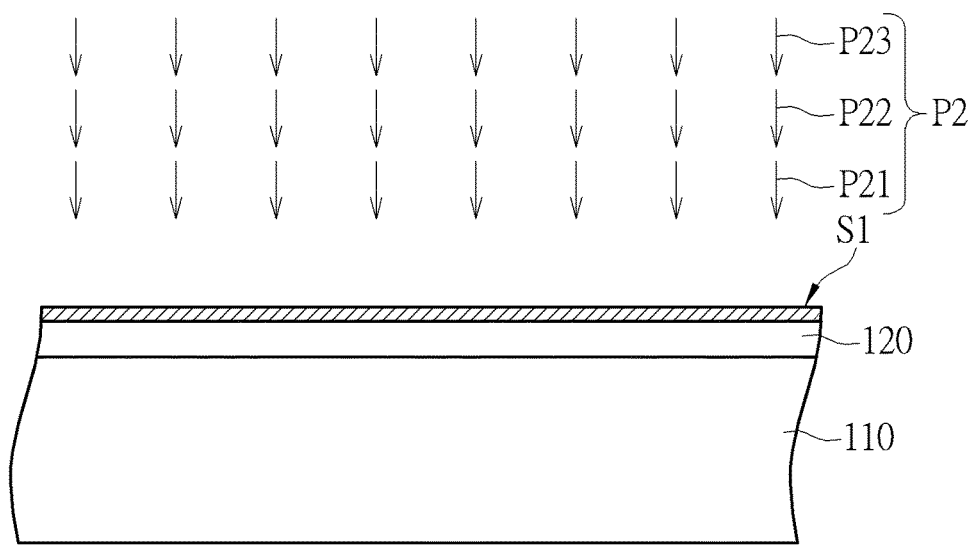

As shown in FIG. 3, a multi-step post nitridation annealing process P2 is performed on the gate dielectric layer 120 after the nitridation process P1 is performed. Preferably, the multi-step post nitridation annealing process P2 is performed immediately after the nitridation process P1 is performed. In the present invention, the multi-step post nitridation annealing process P2 must contain two oxygen-containing annealing steps with different annealing temperatures to achieve different purposes such as decreasing defects or pin-hole in the gate dielectric layer 120 via a relatively higher annealing temperature and then fixing the surface S1 of the gate dielectric layer 120 via a relatively lower annealing temperature.

In this embodiment, the multi-step post nitridation annealing process P2 is a multi-step rapid thermal processing (RTP) process, and the multi-step post nitridation annealing process P2 is a three-step post nitridation annealing process, but is not limited thereto. Thus, the multi-step post nitridation annealing process P2 may include one nitrogen gas annealing step P21, and the two oxygen-containing annealing steps such as a first oxygen gas annealing step P22 and a second oxygen gas annealing step P23 can be performed in-situ. Preferably, nitrogen gases are imported during the nitrogen gas annealing step P21, and then oxygen gases are imported in-situ during the first oxygen gas annealing step P22 and the second oxygen gas annealing step P23. In one case, the nitrogen gases imported during the nitrogen gas annealing step P21 are still imported during the first oxygen gas annealing step P22 and the second oxygen gas annealing step P23 to control oxygen gases reacting to the gate dielectric layer 120, but this is not limited thereto. In another case, the nitrogen gases imported during the nitrogen gas annealing step P21 may stop being imported during the first oxygen gas annealing step P22 and the second oxygen gas annealing step P23 to increase oxygen gases reacting to the gate dielectric layer 120. More precisely, the flow rate of the nitrogen gases imported during the nitrogen gas annealing step P21 may remain the same as during the first oxygen gas annealing step P22 and the second oxygen gas annealing step P23, but this is not limited thereto. Furthermore, the flow rates of the oxygen gases imported during the first oxygen gas annealing step P22 and the second oxygen gas annealing step P23 may be the same.

The nitrogen gas annealing step P21 serves to keep nitrogen atoms at the surface S1 of the gate dielectric layer 120. In a preferred embodiment, the annealing temperature of the nitrogen gas annealing step P21 is within a range of 900~1100° C. In a still preferred embodiment, the annealing temperature of the nitrogen gas annealing step P21 is 1000° C. to keep nitrogen atoms at the surface S1 of the gate dielectric layer 120. In one case, the annealing time of the nitrogen gas annealing step is 15~45 seconds.

After the nitrogen gas annealing step P21 is performed, the first oxygen gas annealing step P22 and the second oxygen gas annealing step P23 are performed sequentially. In the present invention, the annealing temperature of the second oxygen gas annealing step P23 is lower than the annealing temperature of the first oxygen gas annealing step P22 for achieving different purposes. As the first oxygen gas annealing step P22 has a relatively higher temperature, defects and pin-hole issue can be reduced by filling oxygen atoms into these areas while also keeping nitrogen atoms at the surface S1 of the gate dielectric layer 120 or even pushing nitrogen atoms to the surface S1 of the gate dielectric layer 120 via oxygen atoms. As the second oxygen gas annealing step P23 having a relatively lower temperature is performed after the first oxygen gas annealing step P22, the surface S1 of the gate dielectric layer 120 which was damaged or degraded during previous processes or processing steps can be fixed and repaired without further pushing nitrogen atoms of the gate dielectric layer 120 to the surface S1.

Preferably, the annealing temperature of the first oxygen gas annealing step P22 is within a range of 900~1100° C. Still preferably, the annealing temperature of the first oxygen gas annealing step P22 is 1000° C. The annealing temperature of the second oxygen gas annealing step P23 is preferably lower than 800° C. Still preferably, the annealing temperature of the second oxygen gas annealing step P23 is 700° C. In one case, the annealing time of the first oxygen gas annealing step P22 is 1~5 seconds while the annealing time of the second oxygen gas annealing step P23 is 15~45 seconds.

Figure 5:
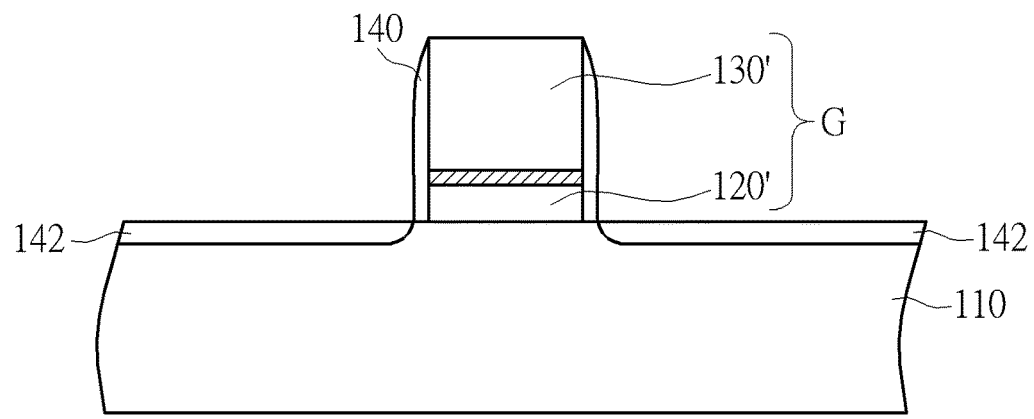
Figure 6:
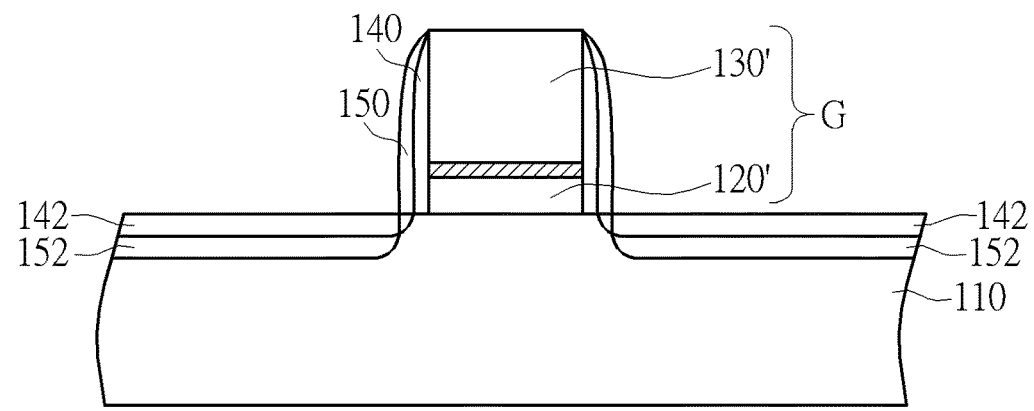
Figure 7:
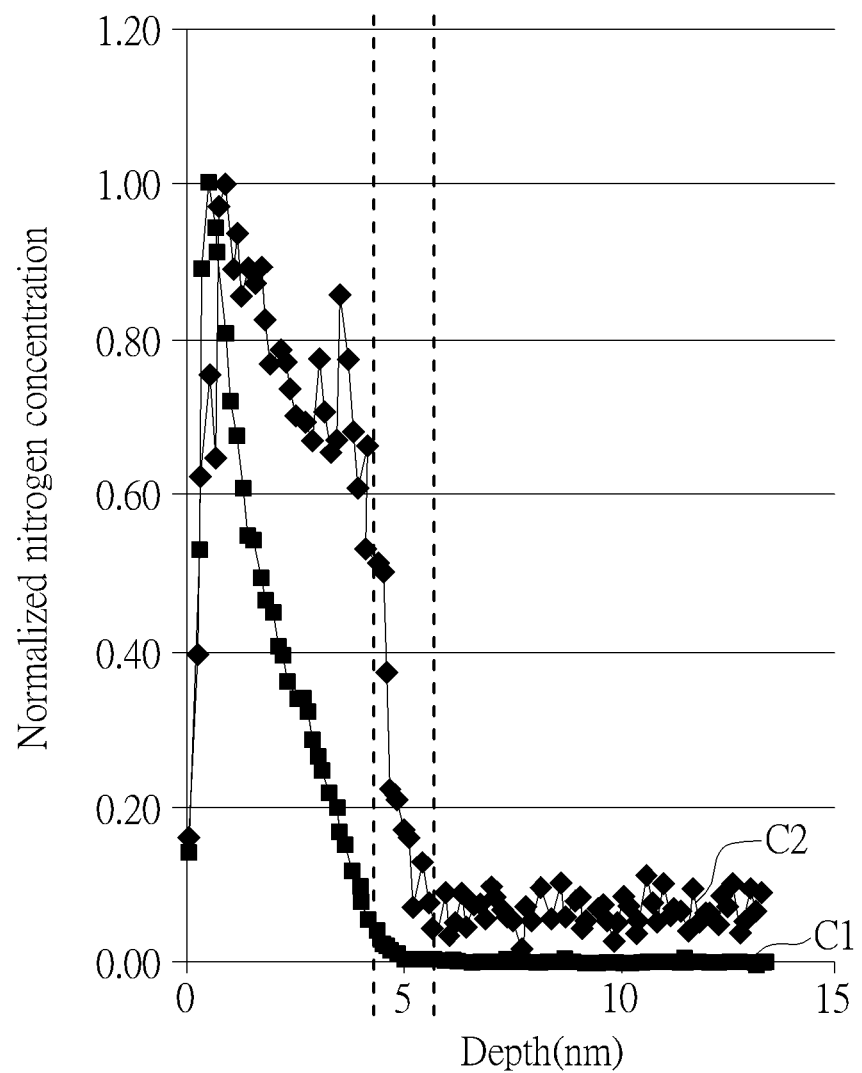
FIG. 7 schematically depicts a flow chart of normalized nitrogen concentration versus depth of a gate dielectric layer for a MOS transistor according to FIGS. 1-6 and another embodiment.

As shown in FIG. 7, which schematically depicts a flow chart of normalized nitrogen concentration versus depth of a gate dielectric layer for a MOS transistor according to FIGS. 1-6 and another embodiment, a curve C1 represents the relation of normalized nitrogen concentration versus depth of a gate dielectric layer 120 of the present invention applying the three-step post nitridation annealing process P2. In addition, a curve C2 represents the relation of normalized nitrogen concentration versus depth of a gate dielectric layer applying a two-step post nitridation annealing process, which only includes one nitrogen gas annealing step and one oxygen gas annealing step. The curve C1 has a smooth profile and most of the nitrogen atoms concentrate at the surface S1 of the dielectric layer 120; the concentration of the nitrogen atoms decreases dramatically as the distance from the gate dielectric layer 120 to the surface S1 is increased. In addition, the curve C2 has an unstable profile with nitrogen atoms having random distribution at a depth less than 6 nanometers. Thereby, the dielectric layer 120 of the present invention having the curve C1 has a better reliability, negative bias temperature instability (NBTI), yields and circuit leakage performance.

Although the multi-step post nitridation annealing process P2 is a three-step post nitridation annealing process in this embodiment, the multi-step post nitridation annealing process P2 of the present invention may include other multiple steps. The two oxygen-containing annealing steps must be included in the multi-step post nitridation annealing process P2, however. The two oxygen-containing annealing steps may be the first oxygen gas annealing step P22 and the second oxygen gas annealing step P23 sequentially performed, but this is not limited thereto. In one case, the first oxygen gas annealing step P22 and the second oxygen gas annealing step P23 may be performed without previously performing the nitrogen gas annealing step P21.

Figure 4:
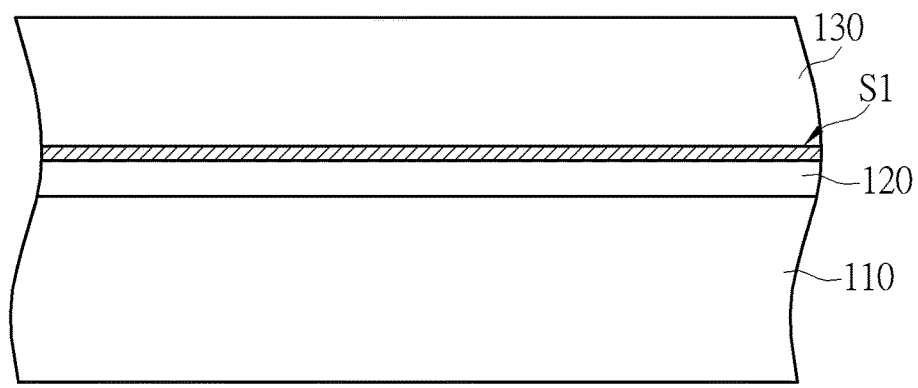

As shown in FIG. 4, an electrode layer 130 is formed on the gate dielectric layer 120. The electrode layer 130 and the gate dielectric layer 120 may be performed in the same cluster tool. This means that the electrode layer 130 can be formed in-situ on the gate dielectric layer 120 immediately after the multi-step post nitridation annealing process P2 is performed without exposing the gate dielectric layer 120 to the air; the processing chambers for forming the gate dielectric layer 120 and forming the electrode layer 130 are more likely to be different, however. In this embodiment, the electrode layer 130 is a polysilicon layer, and the method of forming a gate dielectric layer of the present invention can be used to form a MOS transistor having a polysilicon gate, but is not limited thereto.

As shown in FIG. 5, the electrode layer 130 and the gate dielectric layer 120 may be patterned to form a gate G including a gate dielectric layer 120' and an electrode layer 130'. A first spacer 140 may be formed on the substrate 110 next to the gate G for defining a lightly doped source/drain, and therefore a lightly doped source/drain 142 may be formed in the substrate 110 next to the first spacer 140 by self-alignment. Likewise, as shown in FIG. 6, a second spacer 150 may be formed on the substrate 110 next to the gate G for defining a source/drain, and therefore a source/drain 152 may be formed in the substrate 110 next to the second spacer 150 by self-alignment. Thereafter, an epitaxial structure (not shown) may be formed in the substrate. The order of forming the lightly doped source/drain 142, the source/drain 152 and the epitaxial structure may change depending upon practical requirements.

To summarize, the present invention provides a method of forming a gate dielectric layer for a MOS transistor, which forms a gate dielectric layer, performs a nitridation process on the gate dielectric layer, and then performs a multi-step post nitridation annealing process on the dielectric layer. It is emphasized that the multi-step post nitridation annealing process of the present invention must include two oxygen-containing annealing steps with different respective annealing temperatures. The two oxygen-containing annealing steps may be a first oxygen gas annealing step and a second oxygen gas annealing step, wherein the annealing temperature of the second oxygen gas annealing step is lower than the annealing temperature of the first oxygen gas annealing step for achieving different purposes. As the first oxygen gas annealing step has a relatively higher temperature, defects and pin-hole issue can be reduced by filling oxygen atoms into these areas while also keeping nitrogen atoms at the surface of the gate dielectric layer or even pushing nitrogen atoms to the surface of the gate dielectric layer by oxygen atoms; as the second oxygen gas annealing step having a relatively lower temperature is performed after the first oxygen gas annealing step, the surface of the gate dielectric layer that was damaged or degraded during previous processes or processing steps can be fixed and repaired without further pushing nitrogen atoms of the gate dielectric layer to the surface. By doing this, most nitrogen atoms can concentrate at the surface of the gate dielectric layer, the nitrogen concentration can decrease dramatically as the distance from the gate dielectric layer to the surface is increased, and the nitrogen concentration can be distributed smoothly. Thereby, a formed device such as a MOS transistor applying the dielectric layer of the present invention can have a better reliability, negative bias temperature instability (NBTI), yields and circuit leakage performance.

The multi-step post nitridation annealing process may be a three-step post nitridation annealing process. The three-step post nitridation annealing process further includes a nitrogen gas annealing step before the two oxygen-containing annealing steps are performed to keep nitrogen atoms at the surface of the gate dielectric layer.

More precisely, the annealing temperature of the nitrogen gas annealing step is preferably within a range of 900~1100° C. and still preferably 1000° C., and the annealing time of the nitrogen gas annealing step is 15~45 seconds; the annealing temperature of the first oxygen gas annealing step is preferably within a range of 900~1100° C. and still preferably 800° C., and the annealing time of the first oxygen gas annealing step is 1~5 seconds; the annealing temperature of the second oxygen gas annealing step is preferably lower than 800° C. and still preferably 700° C., and the annealing time of the second oxygen gas annealing step is 15~45 seconds.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a gate dielectric layer for a MOS transistor, comprising:
   forming a gate dielectric layer on a substrate;
   performing a nitridation process on the gate dielectric layer; and
   performing a multi-step post nitridation annealing process comprising two oxygen-containing annealing steps with different annealing temperatures on the gate dielectric layer, wherein the two oxygen-containing annealing steps comprise a first oxygen gas annealing step and then a second oxygen gas annealing step, the annealing temperature of the second oxygen gas annealing step is lower than the annealing temperature of the first oxygen gas annealing step, the annealing temperature of the second oxygen gas annealing step is lower than 800° C., and the flow rate of the nitrogen gases imported during the first oxygen gas annealing step is the same as the flow rate of the nitrogen gases imported during the second oxygen gas annealing step, and the flow rate of the nitrogen gases are larger than zero.

2. The method of forming a gate dielectric layer for a MOS transistor according to claim 1, wherein the gate dielectric layer comprises a silicon dioxide layer.

3. The method of forming a gate dielectric layer for a MOS transistor according to claim 1, wherein the nitridation process comprises a decouple plasma nitridation process.

4. The method of forming a gate dielectric layer for a MOS transistor according to claim 1, wherein the annealing temperature of the first oxygen gas annealing step is within a range of 900~1100° C.

5. The method of forming a gate dielectric layer for a MOS transistor according to claim 4, wherein the annealing temperature of the first oxygen gas annealing step is 1000° C.

6. The method of forming a gate dielectric layer for a MOS transistor according to claim 1, wherein the annealing time of the first oxygen gas annealing step is 1~5 seconds.

7. The method of forming a gate dielectric layer for a MOS transistor according to claim 1, wherein the annealing temperature of the second oxygen gas annealing step is 700° C.

8. The method of forming a gate dielectric layer for a MOS transistor according to claim 1, wherein the annealing time of the second oxygen gas annealing step is 15~45 seconds.

9. The method of forming a gate dielectric layer for a MOS transistor according to claim 1, wherein the multi-step post nitridation annealing process comprises a multi-step rapid thermal processing (RTP) process.

10. The method of forming a gate dielectric layer for a MOS transistor according to claim 1, wherein the multi-step post nitridation annealing process comprises a three-step post nitridation annealing process.

11. The method of forming a gate dielectric layer for a MOS transistor according to claim 10, wherein the multi-step post nitridation annealing process comprises one nitrogen gas annealing step, and then the two oxygen-containing annealing steps.

12. The method of forming a gate dielectric layer for a MOS transistor according to claim 11, the multi-step post nitridation annealing process comprises having nitrogen gases imported during the nitrogen gas annealing step, and then having oxygen gases imported in-situ during the two oxygen-containing annealing steps.

13. The method of forming a gate dielectric layer for a MOS transistor according to claim 11, wherein the annealing temperature of the nitrogen gas annealing step is within a range of 900~1100° C.

14. The method of forming a gate dielectric layer for a MOS transistor according to claim 13, wherein the annealing temperature of the nitrogen gas annealing step is 1000° C.

15. The method of forming a gate dielectric layer for a MOS transistor according to claim 11, wherein the annealing time of the nitrogen gas annealing step is 15~45 seconds.

16. The method of forming a gate dielectric layer for a MOS transistor according to claim 1, further comprising:
    forming an electrode layer on the gate dielectric layer after the multi-step post nitridation annealing process is performed.

17. The method of forming a gate dielectric layer for a MOS transistor according to claim 16, further comprising:
    forming a source/drain in the substrate next to the gate dielectric layer.

* * * * *